US012763760B1

(12) United States Patent
Wu

(10) Patent No.: US 12,763,760 B1
(45) Date of Patent: Oct. 13, 2026

(54) RAMP-BASED DROOP RECOVERY APPARATUS AND METHOD

(71) Applicant: Movellus Circuits Incorporated, Ann Arbor, MI (US)

(72) Inventor: Xiao Wu, Ann Arbor, MI (US)

(73) Assignee: Movellus Circuits Inc., Ann Arbor, MI (US)

( * ) Notice: Subject to any disclaimer, the term of this patent is extended or adjusted under 35 U.S.C. 154(b) by 142 days.

(21) Appl. No.: 18/655,206

(22) Filed: May 3, 2024

(51) Int. Cl.
*H03K 4/08* (2006.01)
*H03K 5/01* (2006.01)

(52) U.S. Cl.
CPC ................. *H03K 4/08* (2013.01); *H03K 5/01* (2013.01)

(58) Field of Classification Search
CPC .................................. H03K 4/08; H03K 5/01
USPC .......................................................... 327/306
See application file for complete search history.

(56) References Cited

U.S. PATENT DOCUMENTS 8,933,737 B1 * 1/2015 Chatterjee ............... H03L 7/095 327/158
9,552,034 B2 1/2017 Yeager
9,634,676 B2 * 4/2017 Swaminathan ......... H03L 7/099
10,345,834 B2 7/2019 Price et al.
10,790,838 B1 * 9/2020 Mosalikanti ............ H03L 7/085
2003/0112038 A1 * 6/2003 Naffziger ................ G06F 1/305 327/100
2004/0119521 A1 6/2004 Kurd et al.
2012/0187991 A1 * 7/2012 Sathe ..................... H03K 5/135 327/158
2015/0002197 A1 * 1/2015 Chatterjee ............... H03L 7/095 327/155
2017/0005665 A1 * 1/2017 Swaminathan ......... H03L 7/099
2017/0038814 A1 * 2/2017 Pal ............................ G06F 1/08
2019/0064896 A1 2/2019 Das
2019/0086946 A1 * 3/2019 Saint-Laurent ........... G06F 1/10
2021/0181831 A1 * 6/2021 Mosalikanti ............. H03K 5/24
2023/0198528 A1 * 6/2023 Mazumdar ................ H03L 7/16 326/99
2023/0251699 A1 8/2023 Acharya
2023/0314488 A1 * 10/2023 Mosalikanti ............. H03K 5/24 327/113
2024/0106438 A1 * 3/2024 Mazumdar ....... G01R 19/16552

* cited by examiner

*Primary Examiner* — Ryan Jager
(74) *Attorney, Agent, or Firm* — Lance Kreisman; Peninsula Patent Group

(57) ABSTRACT

An integrated circuit (IC) chip includes a voltage supply circuit to provide a supply voltage. A droop recovery circuit is responsive to a droop event acting upon the supply voltage. The droop recovery circuit restores a clock signal from a droop-reduced frequency to a nominal operating frequency. The droop recovery circuit includes a ramp controller to increase the clock frequency from the droop-reduced frequency to the nominal operating frequency over a sloped-step frequency profile during a recovery timing interval corresponding to a timing interval representing a diminishing of the droop event.

8 Claims, 4 Drawing Sheets

RAMP-BASED DROOP RECOVERY APPARATUS AND METHOD

TECHNICAL FIELD

The disclosure herein relates to digital systems, subsystems, integrated circuits, and associated methods.

BACKGROUND

Logic gates in a clock tree path of an integrated circuit (IC) chip, such as flip-flops, generally rely on a stable supply voltage in order to have a consistent setup timing margin. Changes in activity within a digital core of the IC chip often result in supply voltage fluctuations known as "droop." When droop events occur, the setup timing margin for the flip-flops narrows, potentially reaching a threshold where the flip-flops may experience timing errors. The reduced setup timing margin during the droop event may be widened by reducing a frequency of a clock signal applied to the flip-flops. When the droop event ends, the clock signal frequency may be restored to the original value.

Conventionally, droop recovery circuits typically switch directly from the droop-reduced clock frequency to the nominal clock frequency upon expiration of a droop event. Such abrupt changes often trigger follow-on droop events.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Digital systems, subsystems, integrated circuits, and associated methods are disclosed. In one embodiment, an integrated circuit (IC) chip is disclosed. The integrated circuit (IC) chip includes a voltage supply circuit to provide a supply voltage. A droop recovery circuit is responsive to a droop event acting upon the supply voltage. The droop recovery circuit restores a clock signal from a droop-reduced frequency to a nominal operating frequency. The droop recovery circuit includes a ramp controller to increase the clock frequency from the droop-reduced frequency to the nominal operating frequency over a sloped-step frequency profile during a recovery timing interval corresponding to a timing interval representing a diminishing of the droop event. By using the ramp-based droop recovery circuitry to gently restore the clock frequency from the safety frequency to the nominal frequency, follow-on droop events may be avoided, improving the speed of recovery of the clock frequency.

Figure 1:
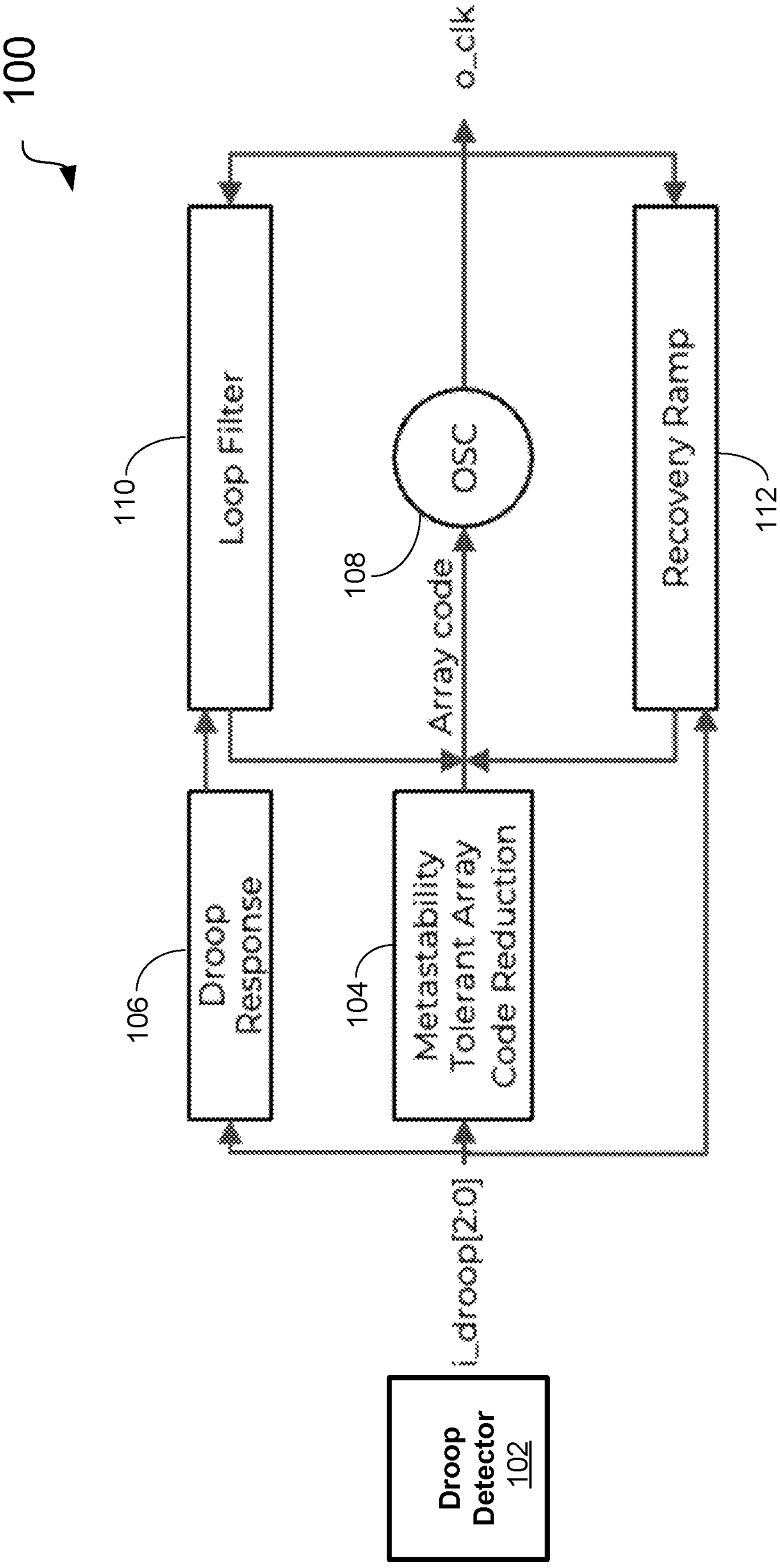
FIG. 1 illustrates a droop response system within an integrated circuit chip that includes a ramp-based droop recovery circuit.

Referring now to FIG. 1, one embodiment of a droop response system, generally designated 100, includes a droop detector 102 that is coupled to an integrated circuit (IC) supply voltage in a manner that allows the droop detector 102 to sense droop events. A droop event generally involves a reduction in the supply voltage that may occur, for example, from processor core activity, self-induced droop or other spurious on-chip events. To maintain a timing margin for a given clock tree path, a nominal operating clock frequency associated with the clock tree path is often reduced. For one embodiment, when a droop event is detected, the droop detector 102 generates a droop code i_droop[2:0] that, for one specific embodiment, is fed to an asynchronous metastability-tolerant array code reduction unit 104, and a droop response controller 106.

Further referring to FIG. 1, the metastability-tolerant array code reduction unit 104 generally produces a reduced array code that is fed to a digital oscillator 108 to generate a reduced "safety" clock frequency for the clock tree path. While the clock frequency is being reduced, the droop response controller 106 interacts with a loop filter 110 to internally generate appropriate oscillator codes to catch up with the reduced array code. Further detail regarding one embodiment of a droop response system that includes the droop detector 102, the metastability-tolerant array code reduction unit 104, the droop response controller 106, and the loop filter 110 is disclosed in copending U.S. patent application Ser. No. 18/655,204 filed May 3, 2024, titled "METASTABILITY-TOLERANT DROOP RESPONSE APPARATUS AND METHOD", assigned to the assignee of the instant application, and expressly incorporated by reference herein.

Further referring to FIG. 1, for one embodiment, the droop response system 100 includes a recovery ramp circuit 112 to restore the clock frequency from the reduced "safety" frequency back to the nominal clock frequency in a manner that avoids triggering additional droop events. This is generally done through a unique ramping response method, more fully described below.

Figure 2:
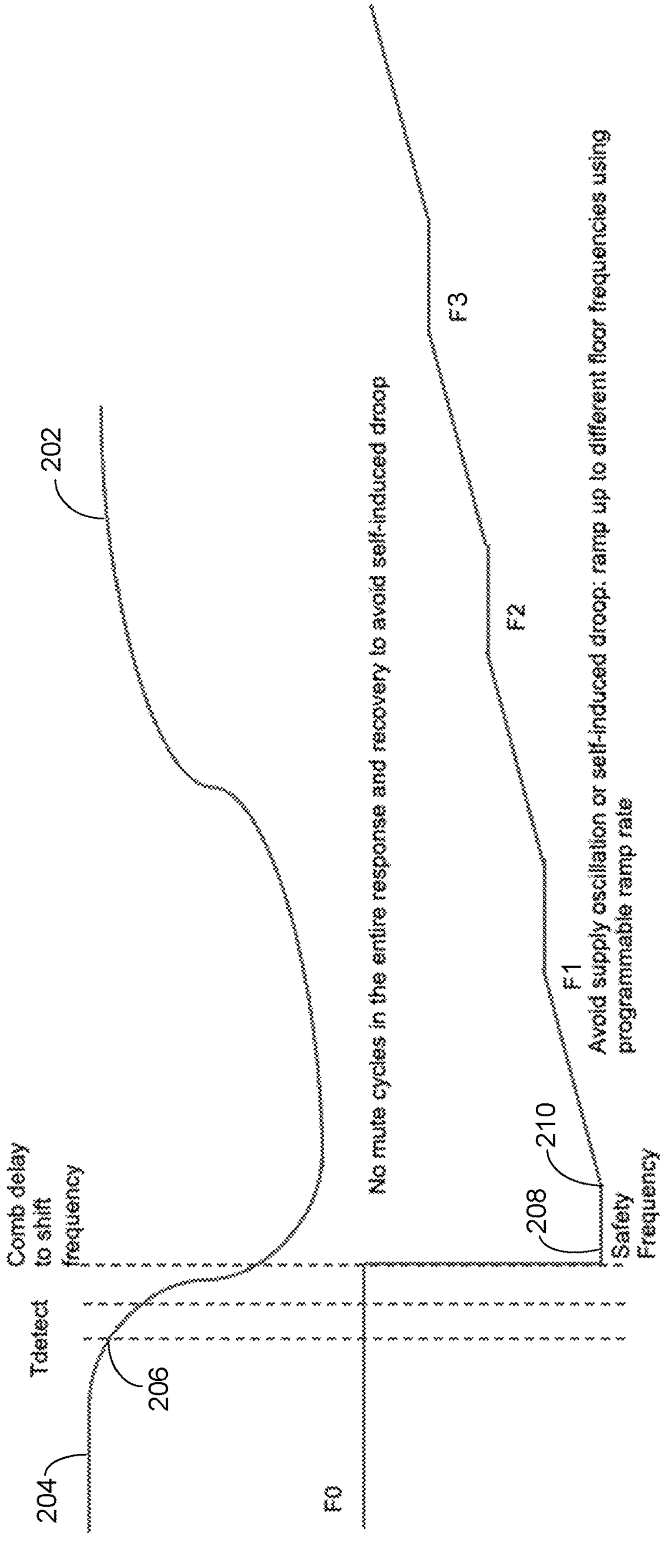
FIG. 2 illustrates a graph that illustrates a supply voltage impacted by a droop event, and a sloped ramping recovery of a clock frequency from a safety frequency to a nominal operating frequency.
Figure 3:
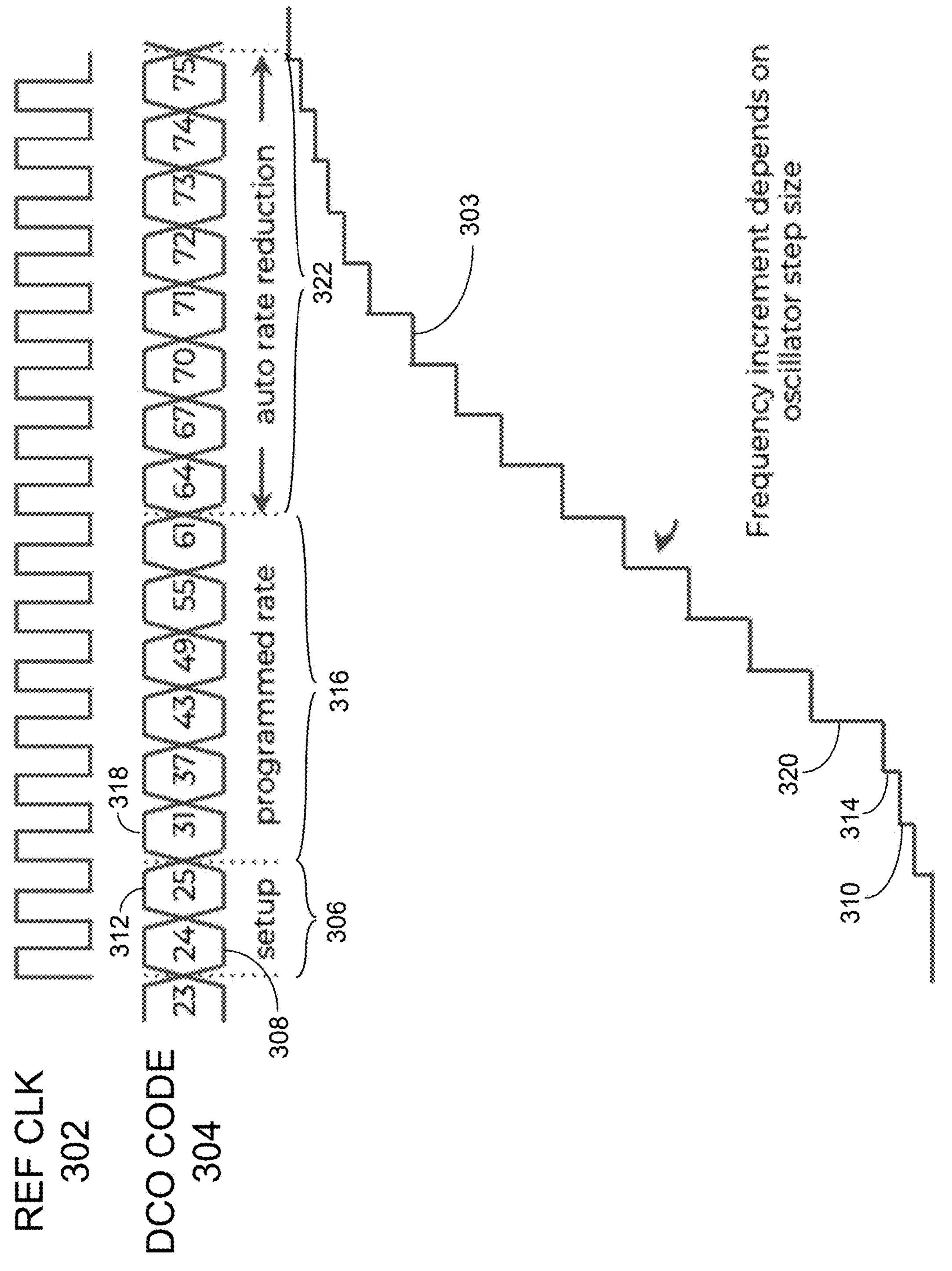
FIG. 3 illustrates further detail regarding how the sloped ramping recovery profile is generated.

FIGS. 2 and 3 illustrate one specific embodiment of the recovery ramping circuit 112, and associated method steps carried out during its operation, which involves responses to programmed settings and instructions to carry out various droop response techniques.

Referring now to FIG. 2, a dynamically-varying voltage supply curve is illustrated, at 202, corresponding to a representative droop event that may occur during operation of the droop recovery system 100. At 204, the supply voltage is at a relatively constant level that safely powers the integrated circuit so that an associated clock signal may be driven at a high nominal operating frequency F0 with the circuitry clocked by the clock signal having sufficient timing margin to safely operate without excessive bit errors. Due to one or more of a variety of factors, such as internal core activity or other spurious activity, the supply voltage may drop from the constant level to a lower level, at 206. In response to the voltage change, the droop detector 102 initiates the generation of a reduced array code to lower the clock frequency from the nominal operating frequency F0, to the "safety" frequency, at 208. For one embodiment, the "safety" frequency is a predetermined clock frequency setting based on the detected severity of the voltage droop, and a frequency at which circuitry coupled to the clock tree path may maintain an adequate timing margin to avoid bit errors.

With continued reference to FIG. 2, at 210, the droop detector 102 determines that the droop event has reached a minimum, with an expectation that the droop will diminish and the voltage supply level returned to normal. At this point, the recovery ramp circuitry 112 generates an increasing frequency code that results in a linear ramping of the clock frequency from the safety frequency to a first intermediate level F1. For one embodiment, the rate of increase for the ramp may be programmed so as to avoid any supply oscillations or self-induced droop. For some embodiments, the frequency may remain at the first intermediate frequency F1 until the droop detector code indicates that the droop has diminished further. Additional intermediate frequency steps, such as at F2 and F3, may be programmed and maintained in the ramping frequency profile depending on the severity of the droop event, and the clock frequencies and timing margin involved in the clock tree path.

FIG. 3 illustrates further detail for one embodiment of a ramp profile technique used to generate a frequency profile. A reference clock frequency curve REF CLK 302 is shown as a frame of reference for a series of digitally-controlled oscillator (DCO) code settings DCO CODE 304. For one embodiment, each DCO code setting corresponds to each cycle of the reference clock, and may change depending on a given programmed setting.

Further referring to FIG. 3, below the DCO code sequence is a slope-stepped digital curve 303 representing changes in the clock frequency brought on by each change in the DCO code. The steepness of each step generally corresponds to the rate of change in the DCO code. For instance, during an initial setup interval in the recovery response, at 306, a first DCO code setting "24", at 308, generates a small increase in the clock frequency from a prior level, shown at 310. A subsequent code setting during the setup interval, at 312, incremented by a single step size of +1, is shown impacting the clock frequency profile at 314.

With continued reference to FIG. 3, once the droop detector code indicates that the droop level is diminishing, the changes to the DCO code may take on a more pronounced level of change to more heavily increase the ramp rate. For example, during a "programmed rate" interval, at 316, the DCO code is changed, at 318, by five codes (to "31" from "25"). The resulting step change in the frequency profile is shown at 320. For one embodiment, the rate of change for each subsequent code change, along with the number of clock cycles before each change is implemented may be programmable via register circuitry and/or firmware instructions.

Further referring to FIG. 3, the "programmed rate" interval may continue for a predetermined number of clock cycles to ramp the clock frequency up via a maximum rate of change until a programmed threshold is reached (indicated by the droop detection code), and the droop response system enters an "auto rate reduction" interval, at 322. The auto-rate reduction interval applies a pre-programmed subprofile of DCO codes, sequenced to smooth out the rate of change in the codes so as to smoothly arrive at an end-desired frequency level corresponding to the original nominal operating frequency with minimal ringing or overshoot.

Figure 4:
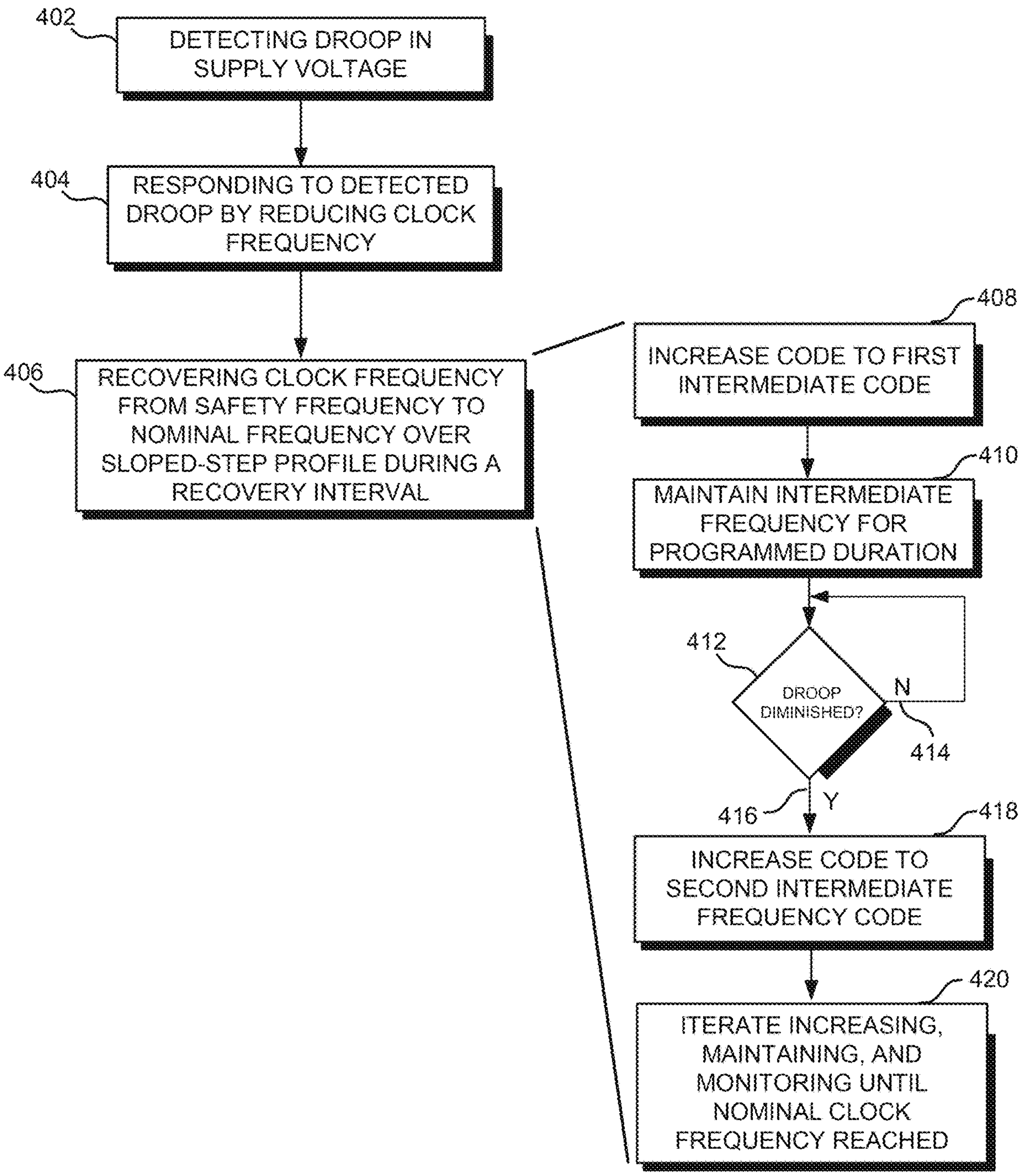
FIG. 4 illustrates a flowchart of steps corresponding to a method of operation of the ramp-based droop recovery circuit of FIG. 3.

In operation, the ramp-based droop recovery circuitry performs a series of steps that are orchestrated by the ramp controller 112, and that correspond to the flowchart steps shown in FIG. 4. As a droop event begins, the droop detector 102 generates a droop detection code that provides an indication that it has detected droop in the supply voltage, at 402. The clock frequency of the clock associated with the clock tree path is reduced from its nominal operating frequency to a reduced safety frequency, at 404. Once the droop event begins to diminish, the recovery response circuit 112 restores the clock frequency from the safety frequency to the nominal frequency over a sloped-step profile during a recovery interval, at 406.

Further referring to FIG. 4, and consistent with the description above, generating the sloped-step recovery profile, according to one embodiment, involves increasing the DCO frequency code from a reduced code corresponding to the safety frequency, to a first intermediate code corresponding to a first intermediate frequency, at 408. In some embodiments, the first intermediate frequency may be maintained via a programmed setting for one or more reference clock cycles, at 410. In some embodiments, the first intermediate frequency may be maintained at a certain frequency based on a conditional event occurring, such as a determination of the voltage droop diminishing by a predetermined amount, at 412.

With continued reference to FIG. 4, if the determination at 412 indicates no diminishing of the voltage droop, at 414, then the intermediate frequency level may be maintained. If the determination at 412 indicates that the voltage droop has diminished at least to the predetermined threshold level, at 416, then the DCO code may be increased to a subsequent intermediate frequency level, at 418. The maintaining of the frequency, at 410, the determination of the voltage droop diminishing, at 412, and the increasing of the clock frequency code, at 418, may iterate, at 420, until the nominal clock frequency is reached, which should coincide with the termination of the voltage droop event within a certain number of reference clock cycles.

The droop response circuitry described above allows for a predictable and programmably efficient way to recover a nominal operating clock frequency following a droop event. Not only are follow-on droop events avoided through implementation of the gradual ramping technique, but mute cycles in the response are also avoided which also reduces the chances of self-induced droop during recovery.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments.

Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '

(e.g., '$\overline{\langle \text{signal name} \rangle}$')

is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

I claim:

1. An integrated circuit (IC) chip, comprising:

a voltage supply circuit to provide a supply voltage;

a droop recovery circuit responsive to a droop event acting upon the supply voltage, the droop recovery circuit to restore a clock signal from a droop-reduced frequency to a nominal operating frequency, the droop recovery circuit comprising a ramp controller to increase the droop-reduced frequency to the nominal operating frequency over a sloped-step frequency profile during a recovery timing interval, the sloped-step frequency profile comprising a first ramping from the droop-reduced frequency to a first intermediate frequency that is less than the nominal operating frequency, wherein the first intermediate frequency is user-programmable via a first frequency setting and is maintained at a constant value for a first predetermined duration, the first predetermined duration being user-programmable via a first duration setting, the recovery timing interval corresponding to a timing interval representing a diminishing of the droop event; and a digitally-controlled oscillator (DCO) circuit to generate the clock signal, the DCO responsive to application of a first digital code to generate the droop-reduced frequency, and responsive to iterative application of a progressively increasing digital code to generate the sloped-step frequency profile.

2. An integrated circuit (IC) chip comprising:

a voltage supply circuit to provide a supply voltage;

a droop recovery circuit responsive to a droop event acting upon the supply voltage, the droop recovery circuit to restore a clock signal from a droop-reduced frequency to a nominal operating frequency, the droop recovery circuit comprising a ramp controller to increase the droop reduced frequency to the nominal operating frequency over a sloped-step frequency profile during a recovery timing interval, the sloped-step frequency profile comprising a first ramping from the droop-reduced frequency to a first intermediate frequency that is less than the nominal operating frequency, the sloped-step frequency profile comprising a conditional ramping from the first intermediate frequency to a second intermediate frequency, the conditional ramping based on a detected diminishing of the droop event, wherein the first ramping is in accordance with a first user-programmed ramp rate; and wherein the conditional ramping is in accordance with a second user-programmed ramp rate that is different than the first user-programmed ramp rate.

3. A voltage droop recovery circuit, comprising:

a droop recovery circuit responsive to a droop event acting upon a supply voltage, the droop recovery circuit to restore a clock signal from a droop-reduced frequency to a nominal operating frequency, the droop recovery circuit comprising a ramp controller to increase the droop-reduced frequency to the nominal operating frequency over a sloped-step frequency profile during a recovery timing interval, the sloped-step frequency profile comprising ping from the droop-reduced frequency to a first intermediate frequency that is less than the nominal operating frequency, wherein the first intermediate frequency is user-programmable via a first frequency setting and is maintained at a constant value for a first predetermined duration, the first predetermined duration being user-programmable via a first duration setting, the recovery timing interval corresponding to a timing interval representing a diminishing of the droop event; and a digitally-controlled oscillator (DCO) circuit to generate the clock signal, the DCO responsive to application of a first digital code to generate the droop-reduced frequency, and responsive to iterative application of a progressively increasing digital code to generate the sloped-step frequency profile.

4. The voltage droop recovery circuit of claim 3, wherein: the sloped-step frequency profile includes a conditional ramping from the first intermediate frequency to a second intermediate frequency, the conditional ramping based on a detected diminishing of the droop event.

5. The voltage droop recovery circuit of claim 4, wherein: the first ramping is in accordance with a first user-programmed ramp rate; and the conditional ramping is in accordance with a second user-programmed ramp rate that is different than the first user-programmed ramp rate.

6. A method of operation in an integrated circuit (IC) chip, the method comprising:

providing a supply voltage with a voltage supply circuit;

responding to a droop event acting upon a supply voltage with a droop recovery circuit, the responding including restoring a clock signal from a droop-reduced frequency to a nominal operating frequency, wherein the restoring comprises increasing, with a ramp controller, the clock frequency from the droop-reduced frequency to the nominal operating frequency over a sloped-step frequency profile during a recovery timing interval, the sloped-step frequency profile comprising a first ramping from the droop-reduced frequency to a first intermediate frequency that is less than the nominal operating frequency wherein the first intermediate frequency is user-programmable via a first frequency setting and is maintained at a constant value for a first predetermined duration, the first predetermined duration being user programmable via a first duration setting, the recovery timing interval corresponding to a timing interval representing a diminishing of the droop event;

generating the clock signal with a digitally-controlled oscillator (DCO) circuit;

responding to application of a first digital code with the DCO to generate the droop-reduced frequency; and responding to iterative application of a progressively increasing digital code to generate the sloped-step frequency profile.

7. The method of claim 6, further comprising:

conditionally ramping from the programmed first intermediate frequency to a second intermediate frequency, the conditionally ramping based on a detected diminishing of the droop event.

8. The method of claim 7, wherein:

the ramping from the droop-reduced frequency to the programmed first intermediate frequency is in accordance with a first user-programmed ramp rate; and the conditional ramping is in accordance with a second user-programmed ramp rate that is different than the first user-programmed ramp rate.

* * * * *